United States Patent

Wang

[11] Patent Number: 5,970,359
[45] Date of Patent: Oct. 19, 1999

[54] METHOD OF FORMING A CAPACITOR FOR DRAM

[75] Inventor: Chaun-Fu Wang, Taipei Hsien, Taiwan

[73] Assignee: United Microelectronics Corp., Hsinchu City, Taiwan

[21] Appl. No.: 09/187,534

[22] Filed: Nov. 6, 1998

[51] Int. Cl.[6] .................................................. H01L 21/20
[52] U.S. Cl. ...................... 438/396; 438/253; 438/254; 438/397
[58] Field of Search ..................................... 438/396, 397, 438/398, 399, 253, 254, 255, 256; 148/DIG. 14

[56] References Cited

U.S. PATENT DOCUMENTS

| | | | |
|---|---|---|---|
| 5,432,116 | 7/1995 | Keum et al. | 438/397 |
| 5,536,673 | 7/1996 | Hong et al. | 438/397 |
| 5,543,356 | 8/1996 | Keum et al. | 438/397 |
| 5,909,620 | 6/1999 | Wu | 438/254 |
| 7,521,168 | 2/1998 | Wu | 438/253 |

*Primary Examiner*—Tuan H. Nguyen
*Attorney, Agent, or Firm*—Thomas, Kayden, Horstemeyer & Risley, L.L.P.

[57] ABSTRACT

A method of forming a capacitor for DRAM according to the invention is disclosed. The method includes the follow steps: a dielectric layer, an etching stop layer, a first insulating layer, a first conductive layer and a second insulating layer are formed in order on a substrate. A contact hole is formed in the second insulating layer. the first conductive layer, the first insulating layer, the etching stop layer and the dielectric layer. Then, a second conductive layer is formed over the substrate and completely fills the contact hole. The second conductive layer is patterned. Next, a silicon nitride layer is formed adjacently to the patterned second conductive layer. Parts of the second insulating layer and the first conductive layer are removed by using the silicon nitride layer as a mask, thereby exposing parts of the first insulating layer. Afterwards, a third conductive layer is formed over the substrate. Parts of the third conductive layer on the silicon nitride layer and parts of the first insulating layer are removed. Thereafter, the silicon nitride layer, the remaining second insulating layer, the first insulating layer are removed to expose a part of a lower electrode consisting of the remaining first, second and third conductive layers.

19 Claims, 5 Drawing Sheets

METHOD OF FORMING A CAPACITOR FOR DRAM

BACKGROUND OF THE INVENTION

1. Field of the Invention

The invention relates to a method of manufacturing ICs, and more particularly to a method of forming a capacitor for dynamic random access memory (DRAM).

2. Description of the Related Art

In line with continuously enhanced functions in microprocessors for handling much more operations during running programs, high-quality and performance of capacitors in memory cells are urgently required. In general each memory cell included in a high-integration of DRAM consists of a transfer field effect transistor T and a storage capacitor C as shown in FIG. 1. The capacitor C included in an array of capacitors formed on the surface of a semiconductor substrate is used to store one-bit data in a form of binary by charging/discharging. Typically it is defined that the capacitor C stores one-bit data with a logic level 0 when uncharged while stores one-bit data with a logic level 1 when charged. Furthermore, a dielectric 100 fills the space between an upper electrode 102 and a lower electrode 100 for providing a dielectric constant required by the capacitor C. As shown in FIG. 1, the drain of the transfer field effect transistor T is electrically coupled to a bit line BL while the source thereof is electrically coupled to one end of the capacitor C. Moreover the gate of the transfer field effect transistor T is electrically coupled to a word line WL which is used to determine whether the transfer field effect transistor T is turned on to electrically connect the bit line and the capacitor C. As can be obviously seen from the above, the capacitor C is indirectly connected to a bit line BL for data access by charging/discharging in coordination with the transfer field effect transistor T.

In a traditional DRAM with a storage capacity of at least 1M bits, 2-dimensional capacitors, called planar type capacitors, are mainly used to store data. However, the planar type capacitors are not suitable for a high-integration of DRAM because take up much more spaces for data storage. Therefore, a high-integration of DRAM with, for example, a storage capacity of 4M bits. needs 3-dimensional capacitors such as stacked type capacitors or trench type capacitors, to complete the performances thereof.

Compared to the planar type capacitors the stacked type capacitors or the trench type capacitors can obtains a great amount of capacitance eve though the DRAM is further reduced in size. However, the simple 3-dimensional capacitor structure is no longer adapted when a much higher-integration of DRAM is introduced.

To resolve this problem a fin type capacitor having electrodes and a corresponding dielectric layer stacked on each other and extended towards the horizontal direction to increase surface areas, resulting in the increase of the capacitance thereof. has been developed. References for related technologies can be made to "3-dimensional stacked capacitor cell for 16M and 64M DRAMs", International Electron Devices Meeting, pp592–595 written by Ema et. al. and U.S. Pat. Nos. 5,071,783, 5,126,810 and 5,206,787.

Additionally to resolve this problem, a cylindrical type capacitor where electrodes and a corresponding dielectric layer are extended to form a vertical structure has been developed. Since the surface areas of the cylindrical type capacitor is increased, the capacitance thereof is increased. References for related technologies can be made to "Novel Stacked capacitor Cell for 64 Mb DRAM", 1989 Symposium on VLSI Technology Digest of Technical Papers, pp69–70 written by Wakamiya et. al. and U.S. Pat. No. 5,077,688.

Duo to the requirement of continuously increasing integration the memory cells of DRAM need to be further shrunk. It is well known by those skilled in the art that the more the memory cells shrink, the less the capacitance thereof will be. This causes the probability of soft error created by the incidence of α ray to increase. Therefore, a structure and a method of forming a capacitor having a desired capacitance. even though the capacitor is further reduced in size, is urgently required.

SUMMARY OF THE INVENTION

In view of the above, an object of the invention is to provide a method of forming a capacitor with a desired capacitance for DRAM even though the capacitor is further reduced in size. Furthermore, the method can increase the tolerance of the process, thereby increasing manufacturing yield and decreasing costs.

To achieve the above-stated object, the method of forming a capacitor for DRAM includes the following steps. First, a substrate having a filed effect transistor formed thereon is prepared. A first dielectric layer, an etching stop layer, a first insulating layer, a first conductive layer, and a second insulating layer are form in order on the substrate and then patterned to form a contact hole therein to expose one of the source/drain regions of the field effect transistor. Next, a second conductive layer is formed over the substrate and completely fills the contact hole to electrically connect the one of the source/drain regions, and then patterned. A silicon nitride layer is formed on both vertical sides of the patterned second conductive layer. Thereafter, using the silicon nitride as a mask parts of the second insulating layer and the first conductive layer are removed to expose parts of the first insulating layer. A third conductive layer is formed over the substrate. Subsequently, parts of the third conductive layer on the silicon nitride layer and parts of the first insulating layer are removed to expose the silicon nitride layer and the parts of the first insulating layer. The silicon nitride layer, the second insulating layer and the first insulating layer are removed in order to expose a part of a lower electrode consisting of the remaining first, second and third conductive layers. A second dielectric layer is formed on the surface of the exposed part of the lower electrode. Afterwards, a fourth conductive layer is formed over the substrate and completely covers the second dielectric layer, and then patterned.

BRIEF DESCRIPTION OF THE DRAWINGS

The invention will be more fully understood from the detailed description given hereinbelow and the accompanying drawings which are given by way of illustration only, and thus do not limit the present invention, and wherein.

DETAILED DESCRIPTION OF THE PREFERRED EMBODIMENTS

FIGS. 2A–2H are schematic cross-sectional views showing a method of forming a capacitor for DRAM according to a preferred embodiment of the invention.

Figure 1:
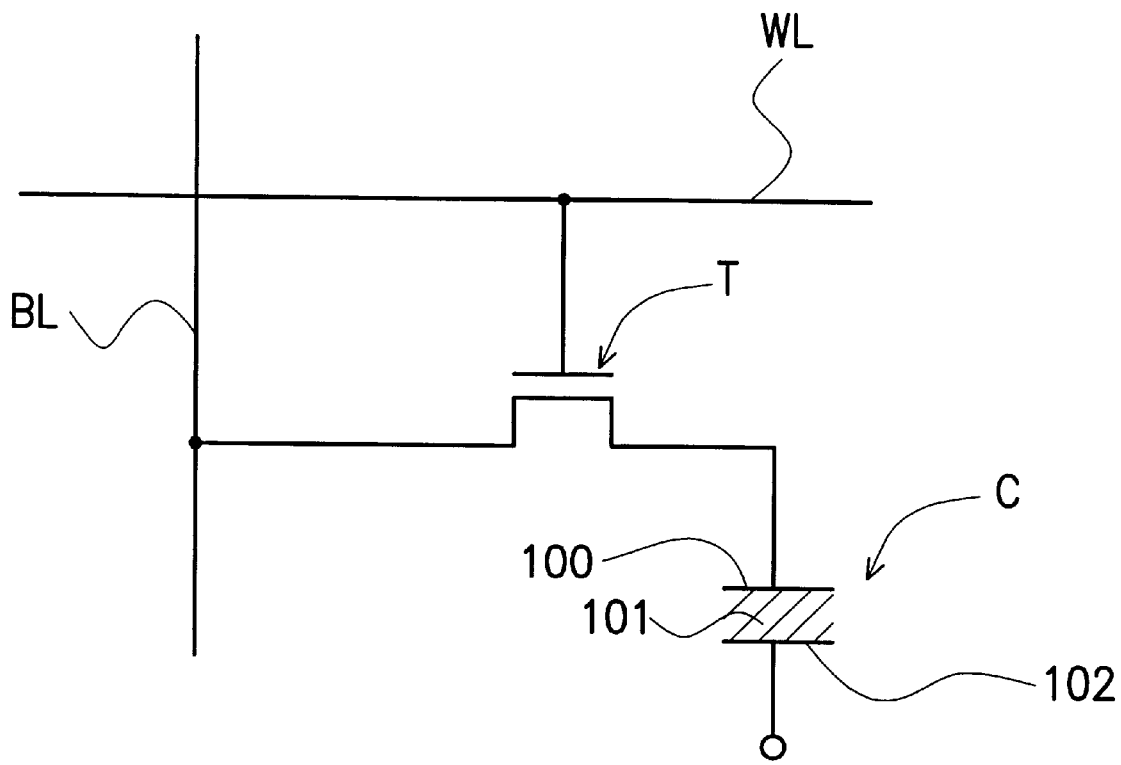
FIG. 1 is a circuit diagram showing a memory cell of a DRAM according to the prior art.
Figure 2A:
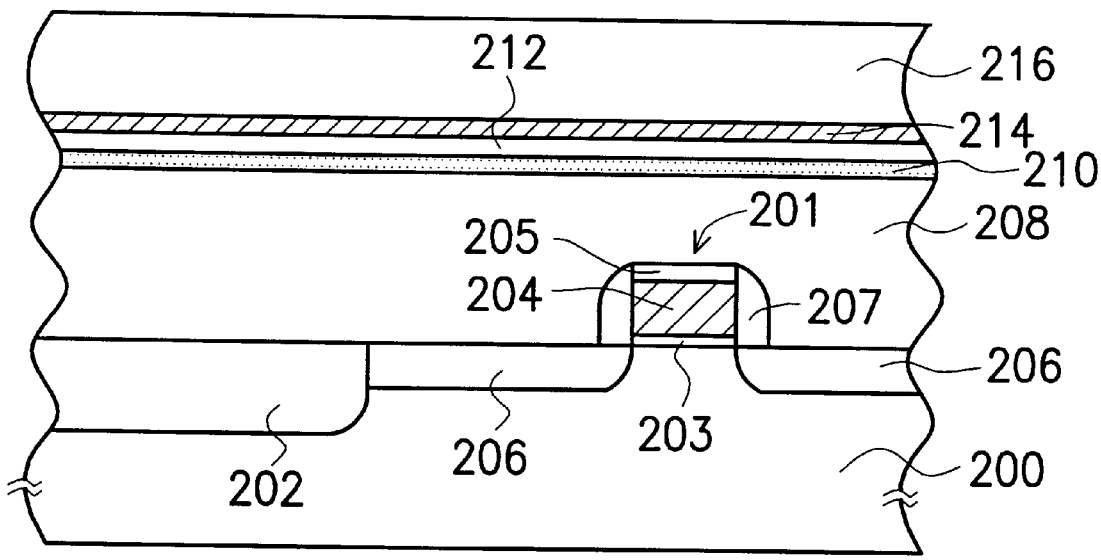
FIGS. 2A–2H are schematic cross-sectional views showing a method of forming a capacitor for DRAM according to a preferred embodiment of the invention.

Referring to FIG. 2A, field oxide regions 202 (only one of them is shown) for defining active regions are formed in a provided substrate 200, such as a P-type silicon substrate, by LOCOS or STI. Field effect transistors 201 (only one of them is shown) are formed on the active regions of the substrate 200. During the formation of each field effect transistor 201. an oxide layer, a conductive layer, such as a doped polysilicon layer, and an insulating layer such as a silicon nitride layer, (not shown) are formed in order on the substrate 200 by for example, chemical vapor deposition (CVD), and then patterned to form a gate oxide layer 203, a conductive gate 204 and a gate insulating layer 205 as shown in FIG. 2A. Source/drain regions 206 are formed in the substrate 200 on both sides of the conductive gate 204 by doping. Next, an insulating layer, such as a silicon nitride layer, (not shown) is formed over the substrate 200 by chemical vapor deposition, and then etched back to form spacers 207 on both vertical sides of the gate oxide layer 203, the conductive gate 204 and the gate insulating layer 205.

Thereafter, a first dielectric layer 208, such as a silicon oxide layer or a BPSG layer, an etching stop layer 210, such as a silicon nitride layer, a first insulating layer 212, such as a silicon oxide layer, a first conductive layer 214, such as a doped polysilicon layer, and a second insulating layer 126, such as a silicon oxide layer, are formed in order on the substrate 200 by, for example, chemical vapor deposition.

Figure 2B:
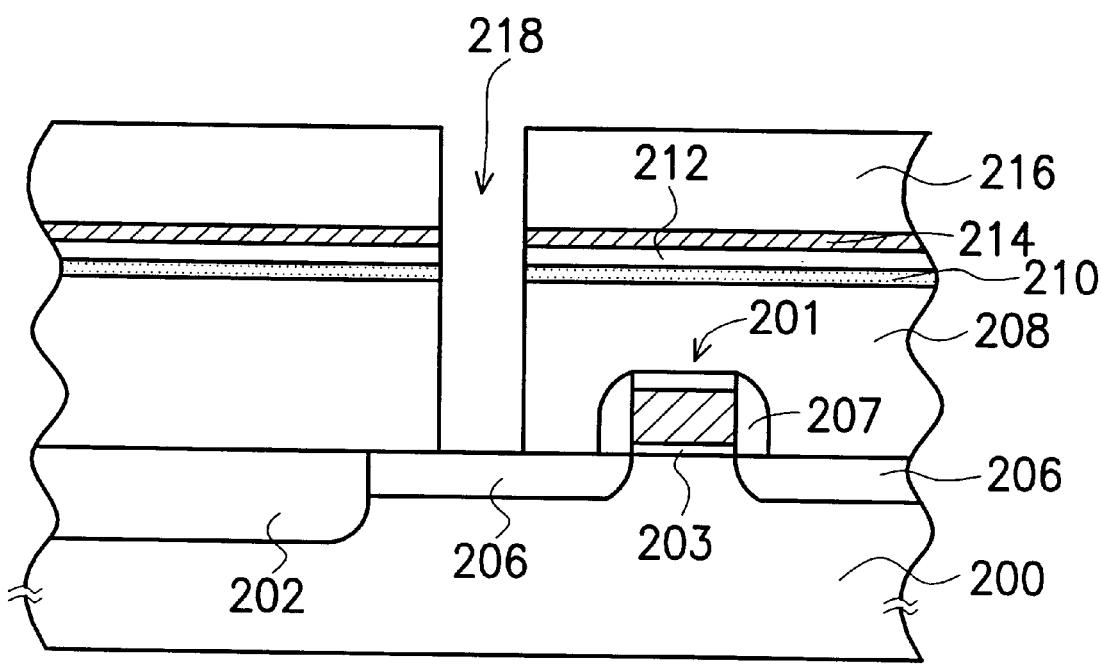

Referring to FIG. 2B, a patterned photoresist layer (not shown) is formed on the second insulating layer 216. Using the photoresist layer as an etching mask, the second insulating layer 216, the first conductive layer 214, the first insulating layer 212, the etching stop layer 210 and the first dielectric layer 208 are etched to form a contact hole 218 therein exposing one of the source/drain regions 206. Then, the photoresist layer is removed.

Figure 2C:
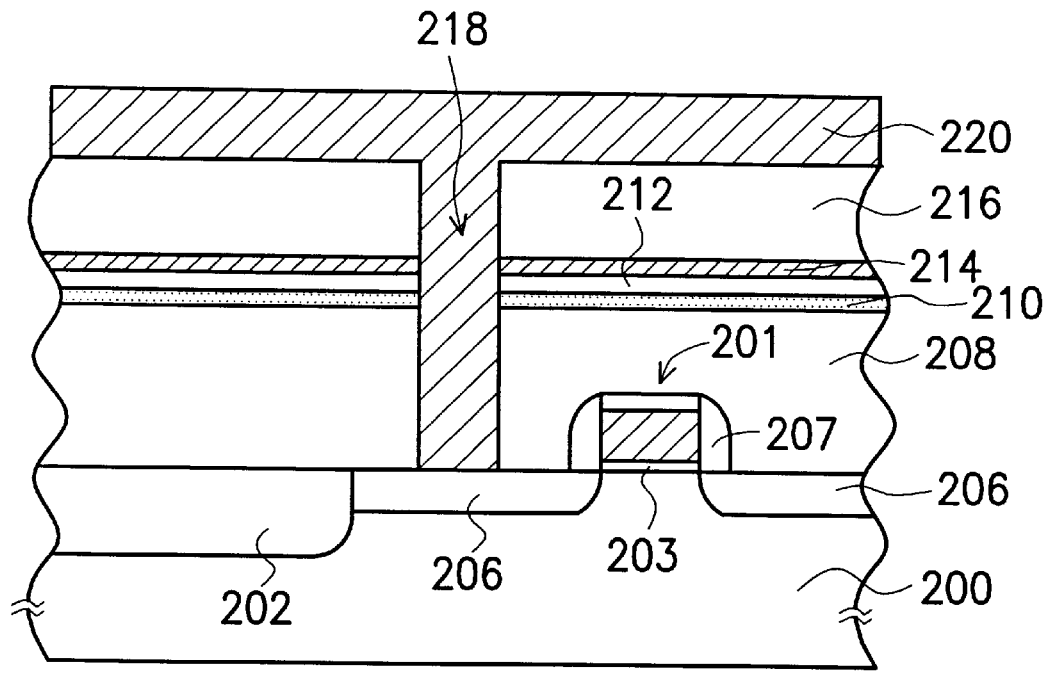

Referring to FIG. 2C, a second conductive layer 220, such as a doped polysilicon layer, is formed over the substrate 200 and completely fills the contact hole 218 to electrically connect the one of the source/drain regions by, for example, chemical vapor deposition.

Figure 2D:
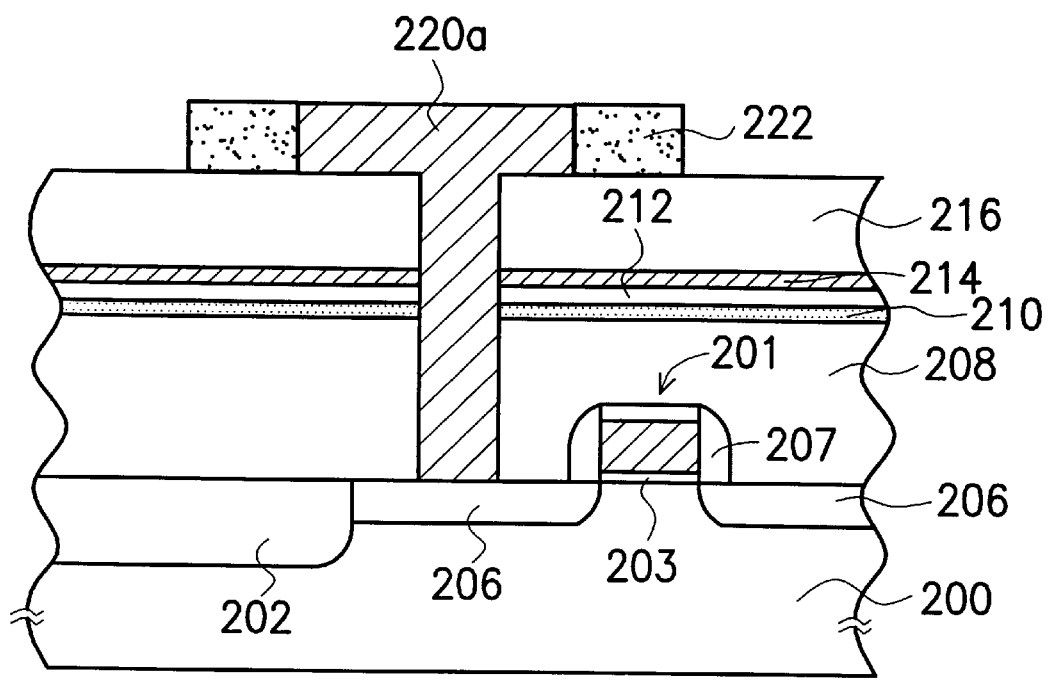

Referring to FIG. 2D, the second conductive layer 220 is patterned to form a patterned second conductive layer 220a and to expose parts of the second insulating layer 216. An insulating layer, such as a silicon nitride layer, (not shown) is formed over the substrate 200, and then etched to from a third insulating layer 222 on both vertical sides of the patterned second conductive layer 220a.

Figure 2E:
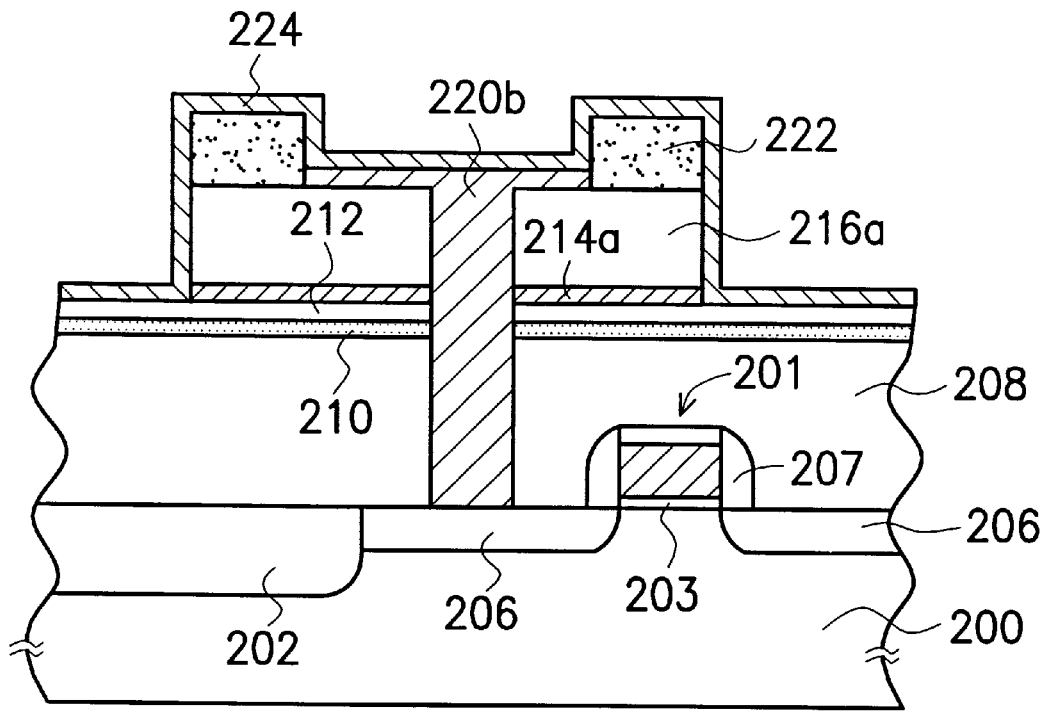

Referring to FIG. 2E, using the third insulating layer 222 as an etching mask, parts of the second insulating layer 216 and the first conductive layer 214 are removed in order by, for example, dry etching and wet etching, respectively, to expose parts of the first insulating layer 212. A third conductive layer 224, such as a doped polysilicon layer, is formed over the substrate 200 by, for example, chemical vapor deposition. Since the first conductive layer 214 and the patterned second conductive layer 220a are formed with the same material, part of the patterned second conductive layer 220a is concurrently removed during etching. Therefore, the thickness of the upper part of the etched second conductive layer 220b becomes thinner.

Figure 2F:
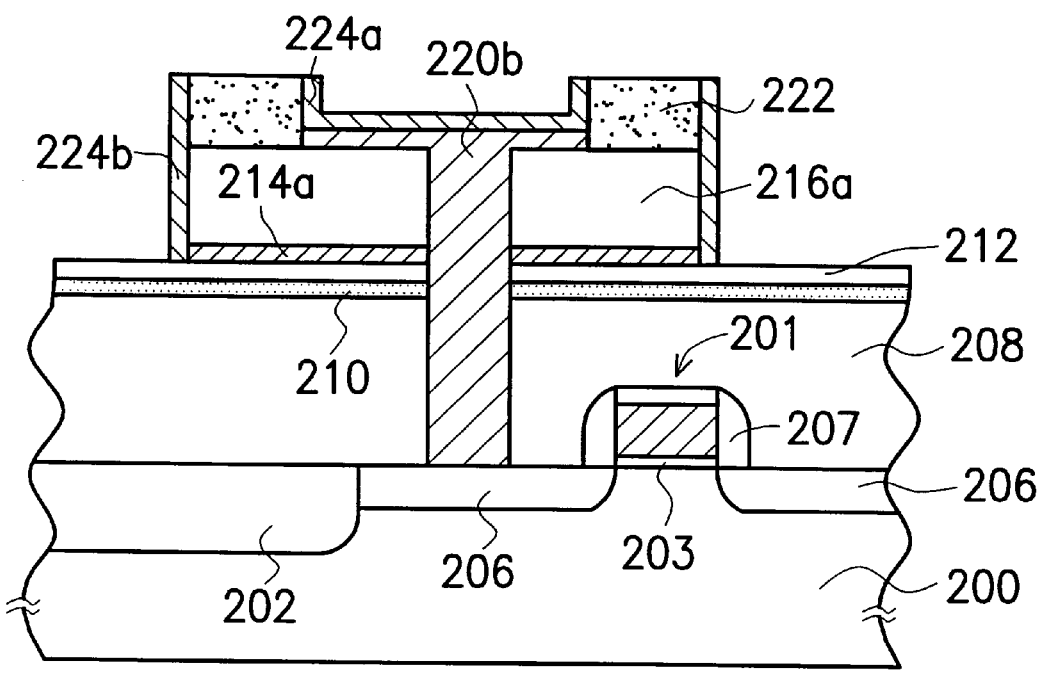

Referring to FIG. 2F, parts of the third conductive layer 224 on the third insulating layer 222 and parts of the first insulating layer 212 are removed to form etched third conductive layers 224a and 224b by, for example, wet etch back using a mixed solution containing nitrous acid and hydrofluoric acid as an etchant.

Figure 2G:
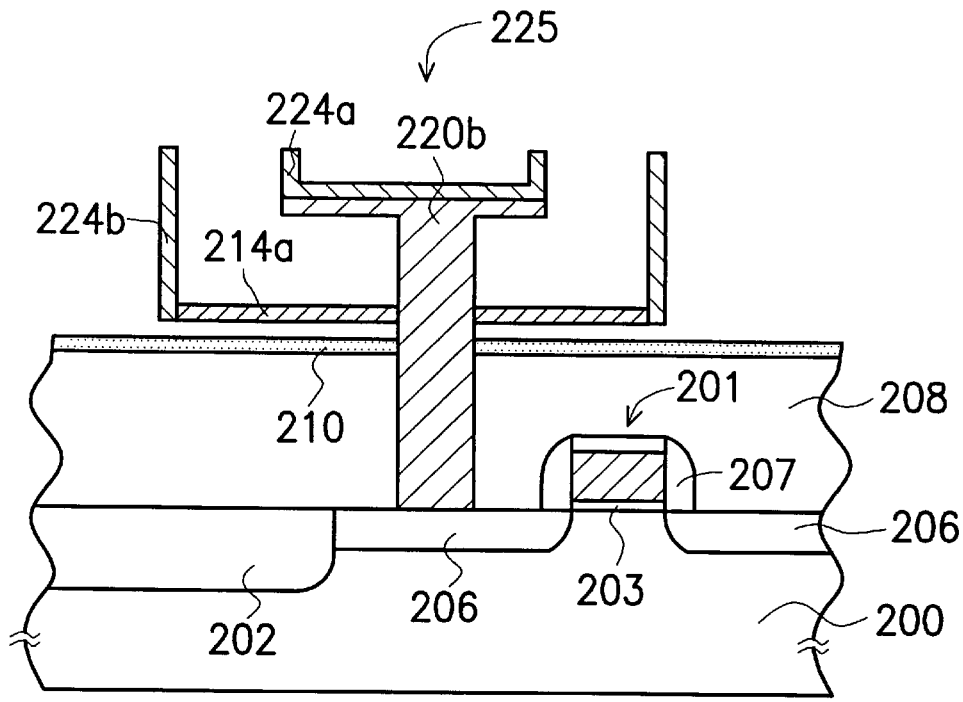

FIG. 2G, the third insulating layer 222 is removed by, for example, wet etching using phosphoric acid as an etchant. The remaining second insulating layer 216a and the first insulating layer 212 are removed by, for example, wet etching using hydrofluoric acid as an etchant, until the etching stop layer 210 is exposed, thereby exposing a part of a tree-shaped lower electrode 225 consisting of the remaining third, second and first conductive layers 224a and 224b, 220b and 214a.

Figure 2H:
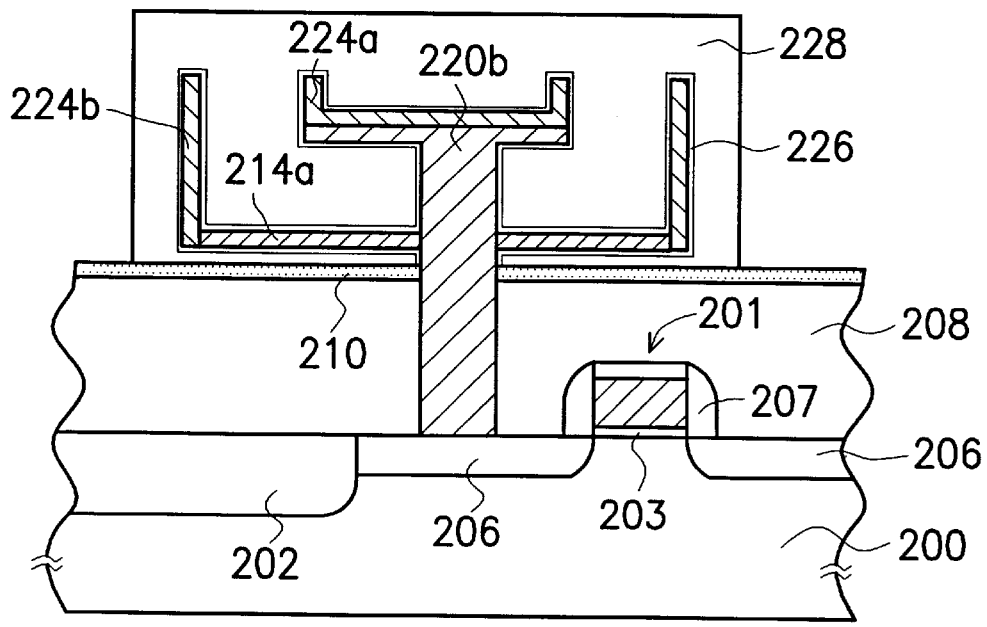

Referring to FIG. 2H, a second dielectric layer 226, such as a silicon oxide layer, a silicon nitride/silicon oxide (NO) layer, a silicon oxide/silicon nitride/silicon oxide (ONO) layer, a ditantalum pentoxide ($Ta_2O_5$) layer, a $Pb(Zr, Ti)O_3$ (PZT) layer or a $(Ba, Sr)TiO_3$ (BST) layer with a high dielectric constant, is formed on the surface of the exposed part of the lower electrode 225. A fourth conductive layer 228, such as a polysilicon layer doped with N-type arsenic ions for increasing electrical conductivity, is formed over the substrate 200 and completely cover the second dielectric layer 226 by, for example, chemical vapor deposition and ion implantation, and then patterned.

Accordingly, since the tree-shaped lower electrode 225 greatly increases the effective surface area of the formed capacitor, the capacitance of thereof for DRAM can be significantly increased.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming a capacitor for DRAM comprising the steps of:

providing a substrate having a field effect transistor with source/drain regions formed thereon;

forming a first dielectric layer, an etching stop layer, a first insulating layer, a first conductive layer and a second insulating layer in order on the substrate;

forming a contact hole in the second insulating layer, the first conductive layer, the first insulating layer, the etching stop layer and the first dielectric layer by patterning, thereby exposing one of the source/drain regions;

forming a second conductive layer over the substrate, the second conductive layer completely filling the contact hole to electrically connect the one of the source/drain regions;

removing parts of the second conductive layer by patterning;

forming a third insulating layer adjacent to both vertical sides of the patterned second conductive layer;

removing parts of the second insulating layer and the first conductive layer to expose parts of the first insulating layer by using third insulating layer as a mask;

forming a third conductive layer over the substrate;

removing parts of the third conductive layer on the third insulating layer and parts of the first insulating layer to expose the third insulating layer and the parts of the first insulating layer;

removing the third insulating layer, the remaining second insulating layer and the first insulating layer to expose a part of a lower electrode consisting of the remaining first, second and third conductive layers by etching;

forming a second dielectric layer on the surface of the exposed part of the lower electrode; and forming a fourth conductive layer over the substrate to completely cover the second dielectric layer.

2. The method of forming a capacitor as recited in claim 1, wherein the first dielectric layer can be made of silicon oxide.

3. The method of forming a capacitor as recited in claim 1, wherein the first dielectric layer can be made of BPSG.

4. The method of forming a capacitor as recited in claim 1, wherein the first insulating layer can be made of silicon oxide.

5. The method of forming a capacitor as recited in claim 4, wherein the etching stop layer can be made of silicon nitride.

6. The method of forming a capacitor as recited in claim 4, wherein the second insulating layer can be made of silicon oxide.

7. The method of forming a capacitor as recited in claim 6, wherein the third insulating layer can be made of silicon nitride.

8. The method of forming a capacitor as recited in claim 1, wherein the step of forming the third insulating layer comprises:

forming a silicon nitride layer over the substrate; and etching the silicon nitride layer.

9. The method of forming a capacitor as recited in claim 1, wherein the first, second and third conductive layers can be made of doped polysilicon.

10. The method of forming a capacitor as recited in claim 9, wherein the first, second and third conductive layers can be formed by chemical vapor deposition.

11. The method of forming a capacitor as recited in claim 1, wherein the step of removing parts of the second insulating layer and the first conductive layer to expose parts of the first insulating layer is performed by dry etching.

12. The method of forming a capacitor as recited in claim 1, wherein the step of removing the third, second and first insulating layers is performed by wet etching.

13. The method of forming a capacitor as recited in claim 1, wherein material used to form the second dielectric layer is selected from one of silicon nitride/silicon oxide, silicon oxide/silicon nitride/silicon oxide, ditantalum pentoxide ($Ta_2O_5$), PZT and BST.

14. A method of forming a capacitor for DRAM comprising the steps of:

providing a substrate having a field effect transistor with source/drain regions formed thereon;

forming a first dielectric layer, a first silicon nitride layer, a first silicon oxide layer, a first polysilicon layer and a second silicon oxide layer in order on the substrate;

forming a contact hole in the second silicon oxide layer, the first polysilicon layer, the first silicon oxide layer, the first silicon nitride layer and the first dielectric layer by patterning, thereby exposing one of the source/drain regions;

forming a second polysilicon layer over the substrate, the second polysilicon layer completely filling the contact hole to electrically connect the one of the source/drain regions;

removing parts of the second polysilicon layer by patterning;

forming a second silicon nitride layer adjacent to both vertical sides of the patterned second polysilicon layer;

removing parts of the second silicon oxide layer and the first polysilicon layer to expose parts of the first silicon oxide layer by using the second silicon nitride layer as a mask;

forming a third polysilicon layer over the substrate;

removing parts of the third polysilicon layer on the second silicon nitride layer and parts of the first silicon oxide layer to expose the second silicon nitride layer and the parts of the first silicon oxide layer;

removing the second silicon nitride layer by using the second silicon oxide layer as an etching stop layer;

removing the remaining second silicon oxide layer, the first silicon oxide layer to expose a part of a lower electrode consisting of the remaining first, second and third polysilicon layers by using the first silicon nitride layer as an etching stop layer;

forming a second dielectric layer on the surface of the exposed part of the lower electrode; and forming a fourth polysilicon layer over the substrate to completely cover the second dielectric layer.

15. The method of forming a capacitor as recited in claim 14, wherein the first dielectric layer can be made of silicon oxide.

16. The method of forming a capacitor as recited in claim 14, wherein the first dielectric layer can be made of BPSG.

17. The method of forming a capacitor as recited in claim 14, wherein the first, second, third and fourth polysilicon layers are formed by chemical vapor deposition.

18. The method of forming a capacitor as recited in claim 14, wherein the step of removing the second silicon nitride is performed by wet etching.

19. The method of forming a capacitor as recited in claim 14, wherein the step of removing the second silicon oxide layer and the first silicon oxide layer are performed by wet etching.

* * * * *